(12) United States Patent
Sabanovic et al.

(10) Patent No.: US 9,358,789 B2
(45) Date of Patent: Jun. 7, 2016

(54) METHOD OF MANUFACTURING FLEXIBLE CIRCUIT SUBSTRACTS

(71) Applicant: Xerox Corporation, Norwalk, CT (US)

(72) Inventors: Mirza Sabanovic, Tigard, OR (US); David P. Platt, Newberg, OR (US); Chad David Freitag, Portland, OR (US); Joseph Andrew Broderick, Portland, OR (US)

(73) Assignee: XEROX CORPORATION, Norwalk, CT (US)

( * ) Notice: Subject to any disclaimer, the term of this patent is extended or adjusted under 35 U.S.C. 154(b) by 239 days.

(21) Appl. No.: 13/973,273

(22) Filed: Aug. 22, 2013

(65) Prior Publication Data

US 2013/0333208 A1 Dec. 19, 2013

Related U.S. Application Data

(62) Division of application No. 13/314,071, filed on Dec. 7, 2011, now Pat. No. 8,529,022.

(51) Int. Cl.
| | |
|---|---|
| *B41J 2/16* | (2006.01) |
| *H05K 3/10* | (2006.01) |
| *H05K 3/00* | (2006.01) |
| *B41J 2/415* | (2006.01) |
| *B41J 2/145* | (2006.01) |
| *B41J 2/175* | (2006.01) |
| *H05K 1/02* | (2006.01) |
| *H05K 1/18* | (2006.01) |

(52) U.S. Cl.
CPC .............. *B41J 2/1623* (2013.01); *B41J 2/145* (2013.01); *B41J 2/1626* (2013.01); *B41J 2/1628* (2013.01); *B41J 2/17593* (2013.01); *B41J 2/415* (2013.01); *H05K 1/0256* (2013.01); *H05K 3/0026* (2013.01); *H05K 3/0029* (2013.01); *H05K 3/0032* (2013.01); *H05K 3/10* (2013.01); *H05K 1/189* (2013.01); *H05K 2201/0154* (2013.01); *H05K 2201/09063* (2013.01); *Y10T 29/49124* (2015.01); *Y10T 29/49155* (2015.01); *Y10T 29/49401* (2015.01)

(58) Field of Classification Search
CPC ........ B41J 2/145; B41J 2/1623; B41J 2/1626; B41J 2/1628; B41J 2/17593; B41J 2/415; H05K 1/0256; H05K 1/189; H05K 2201/0154; H05K 2201/09063; H05K 3/0026; H05K 3/0032; H05K 3/0029; H05K 3/10; Y10T 29/49124; Y10T 29/49155; Y10T 29/49401
See application file for complete search history.

(56) References Cited

U.S. PATENT DOCUMENTS

| | | | | |
|---|---|---|---|---|
| 3,863,261 | A * | 1/1975 | Klein | ............. B41J 2/415 |
| 4,961,806 | A * | 10/1990 | Gerrie et al. | ...... Y10T 29/49124 |
| 5,025,552 | A * | 6/1991 | Yamaoka | ............. H05K 3/0032 |
| 5,170,189 | A * | 12/1992 | Masuda et al. | ........... B41J 2/415 |

FOREIGN PATENT DOCUMENTS

JP 2007203481 A * 8/2007

* cited by examiner

*Primary Examiner* — A. Dexter Tugbang
(74) *Attorney, Agent, or Firm* — Marger Johnson

(57) ABSTRACT

A method of manufacturing a flexible circuit, including forming a first set of traces, forming a second set of traces, and cutting a gap between the first and second set of traces.

10 Claims, 2 Drawing Sheets

METHOD OF MANUFACTURING FLEXIBLE CIRCUIT SUBSTRACTS

CROSS REFERENCE TO RELATED APPLICATION

This application is a Divisional of U.S. patent application Ser. No. 13/314,071, filed on Dec. 7, 2011, titled "Reduction of Arc-Tracking In Chip On Flexible Circuit Substrates," and now U.S. Pat. No. 8,529,022, which is incorporated herein in its entirety.

BACKGROUND

Many devices use flexible circuit substrates. Integrated circuits, or chips, mount on the flexible circuit substrate and use the traces in the flexible circuit substrate like a typical circuit substrate similar to a printed circuit board. The flexible circuit substrate generally consists of polymers and other relatively carbon rich materials. In some instances, the carbon of the flexible circuit substrate can become fuel for an arc event, charring, thermal event, etc.

If an electrical short occurs in a chip mounted on the flexible circuit substrate, such as between the negative voltage supply (Vss) and a high voltage positive supply (Vpp), excessive heat results from the excessive current flow between Vpp and Vss due to the low electrical resistance short within the chip. The short within the chip can be created by different factors, including a defective part, electrical overstress, etc. The high temperature carbonizes the flexible material, and carbon being electrically conductive, this forms another electrically conductive, carbon path outside of chip between the supply traces such as Vpp and Vss or any other nearby trace that becomes involved, such as traces that become shorted to Vpp or Vss, with carbonized flexible material. This further increases the current flow through the lower resistance area, in turn generating more heat. More current produces more heat which carbonizes even more material and the process becomes self-propagating as long as sufficient fuel for generating electrically conductive carbon, such as the flexible circuit substrate, and current from power supplies remain available.

The arc 'tracks' along the current path, carbonizing material along the way. The carbonized material, as in the case of polyimide (Kapton™ is a brand name of a polyimide flexible circuit material), may also release hydrogen that readily ignites and consumes more of the flex material until the entire Vss and Vpp signal planes are carbonized. This problem has resulted in certain substrate materials being banned for use in certain industries such as in the aircraft industry. However, using flexible circuit substrates allows for tighter packaging and smaller devices, as well as typically lower costs.

DETAILED DESCRIPTION OF THE EMBODIMENTS

Figure 1:
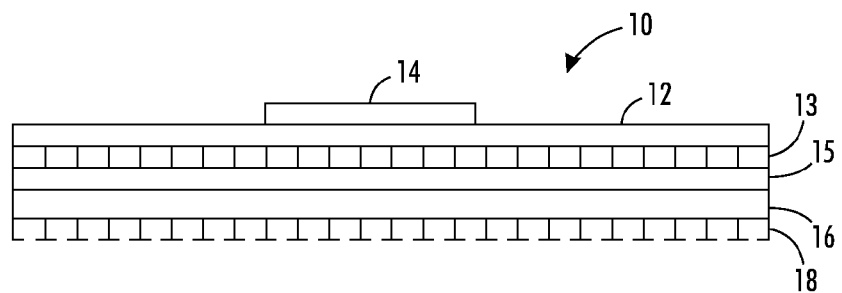
FIG. 1 shows an example of a printhead jet stack employing a flexible circuit substrate.

FIG. 1 shows a block diagram of an ink jet print head 10. One must understand that this provides merely one example of a device that uses integrated circuits on flexible circuit substrates, or 'chip-on-flex' (COF). Any device that employs COF architectures may benefit from the embodiments discussed here. No limitation is implied nor should one be inferred from the examples given here to assist with understanding of the invention.

The print head 10 may operate in a solid-ink printer in which the ink supply consists of solid ink. A heater within the printer melts the ink and transports it to the print head for printing onto a print substrate. The print head typically consists of a nozzle plate, such as 18, having an array of holes or apertures through which ink exits the print head. The nozzle plate 18 may be one of several plates formed into a stack sometimes referred to as a jet stack such as 16.

The plates stack together to form channels and reservoirs within the stack to route the ink to chambers adjacent each nozzle. A membrane 15 operates in response to an array of transducers 13 to fill the chambers with ink and dispense them through the apertures. The transducers in turn receive signals from the flexible circuit substrate 12, the signals in their serial form originating from the printer engine are deserialized by the integrated circuit 14. This integrated circuit also receives power signals, in this example, both negative supply voltage signals, referred to here as Vss, and positive signals, referred to here as Vpp.

A short may occur in the integrated circuit 14 between these two signals that produces excessive current flow because of the low resistance short. Many flexible circuit substrates consist of polymer materials containing carbon and hydrogen. The heat generated from the short can carbonize the flexible material and carbonized material conducts more current, reducing the resistance even more. This starts a chain reaction called "arc-tracking" that continues until it runs out of material or the current is removed. In the process of arc-tracking, some flexible materials such as polyimide releases hydrogen that can readily ignite in a micro-flame, further increasing the temperature and the carbonized area.

Figure 2:
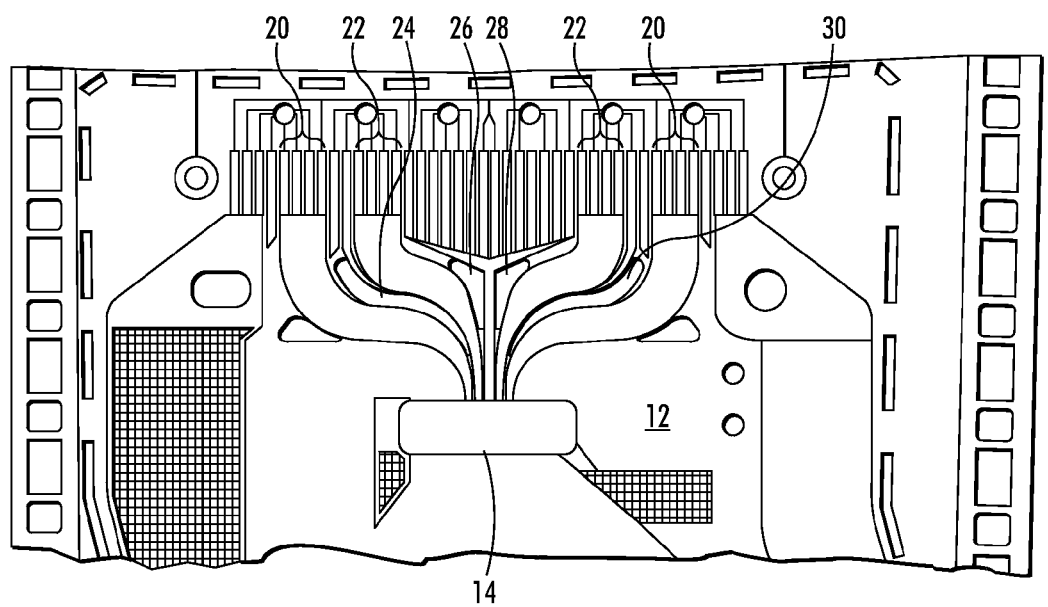
FIG. 2 shows an embodiment of an integrated circuit on a flexible circuit substrate having an arc-break.

By stopping the arc-tracking, one can stop the chain reaction and avoid further destruction of the material as well as avoiding further a larger thermal event. When the arc-tracking stops, the current flow no longer increases, and the localized burned area extinguishes itself. One embodiment that stops arc-tracking employs an arc-break. The arc-breaks may take the form of gaps in the material between the two current paths, Vpp and Vss in the current example, coming out of the integrated circuit. FIG. 2 shows an example of an integrated circuit mounted on a flexible circuit substrate.

In FIG. 2, the integrated circuit 14 resides on a flexible circuit substrate 12. The integrated circuit has traces 20 for the negative supply voltage, and 22 for the positive supply voltage. If a short occurs in the integrated circuit 14, the carbonization will start between the two sets of traces and the arc-tracking will continue until it reaches the first arc-break 24 or 30. The first set of arc-breaks constitutes a primary arc-break as it separates the main high current carrying traces.

A secondary arc-break such as 26 or 28 arranged between the first arc-break and other traces, may also assist in preventing the carbonization from involving other traces such as logic traces in the middle, which would result in current flowing from the supply traces to the logic devices, possibly damaging them. These gaps remove the possibility of carbon creation between high current carrying traces and other nearby traces, such that current is limited to flow through the original short inside the chip and small area of carbonized material near the chip before the arc 'breaks.' This creates a very localized heat that acts as a fuse in that is causes the traces to burn open thereby clearing the short and preventing further current flow.

Figure 3:
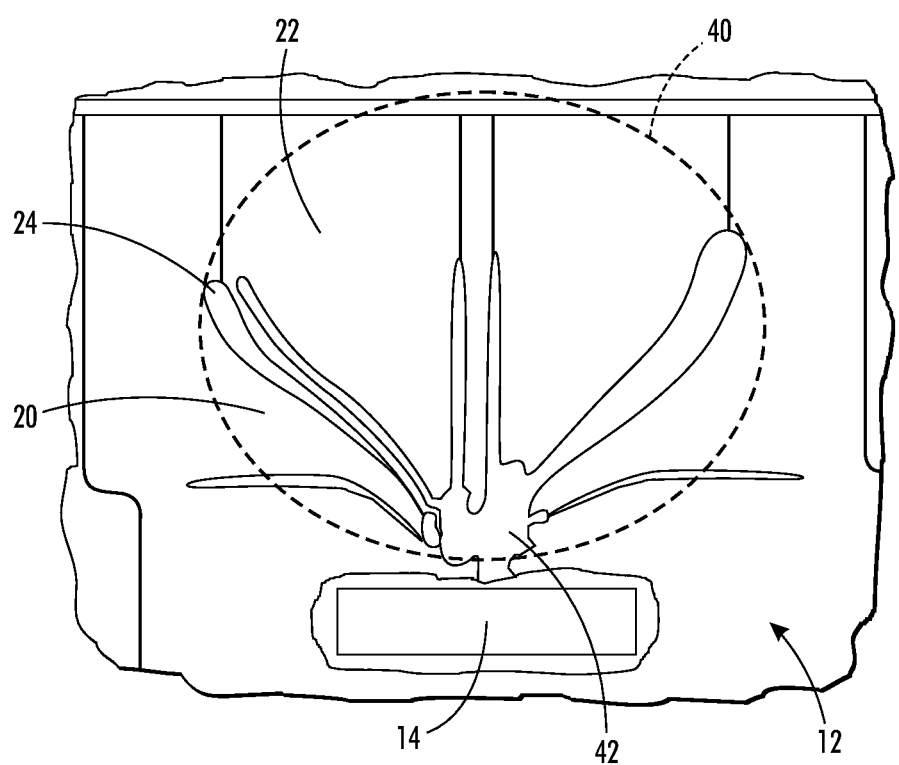
FIG. 3 shows an example of a flexible circuit substrate with an arc-break after an induced thermal event.

FIG. 3 shows an example of an experiment employing arc-breaks. A flexible circuit substrate 12 has an integrated circuit 14. The experiment involved causing a short in the integrated circuit between the Vss and Vpp signals in the integrated circuit. Without the arc-breaks, such as 24, the arc would track up the traces such as 20 and 22 until the material in the flexible circuit substrate in the general region 40 had been consumed. The consumption of this material would have resulted in a much longer arc-tracking event and much more violent charring as the hydrogen released would have further ignited.

However, because of the arc-break, the arc contained itself to the area 42. While damage still occurred to the flexible circuit substrate indicated by 42, no further destruction occurred.

Other forms of arc-breaks may also provide this function. Instead of removing material, one could add a thermal control material in between the traces to stop the arc-tracking. However, additional materials may complicate the manufacturing process and the materials would have to work with the other parts of the manufacturing process.

Removing of the material for the arc-break may take many forms. For existing flexible circuit substrates, the process may include cutting or otherwise forming the arc-break areas. In one embodiment, the material in the arc-break area may undergo laser cutting for removal. The laser cutting may occur as part of the cutting of the flexible circuit substrate from the tape roll upon which it was formed.

In another embodiment, the flexible circuit substrate may undergo processing at formation that removes the material to form the arc-break. The artwork used in forming the flexible circuit substrate may include the regions to be used as an arc-break or breaks.

While the above discussion began in the context of a chip-on-flexible circuit substrate for an ink jet print head, any flexible circuit that have high current carrying traces can use the embodiments described here. Any device that employs a flexible circuit substrate containing carbon and hydrogen could undergo arc-tracking and would benefit from the embodiments here.

It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. A method of manufacturing a flexible circuit, comprising:
    forming a first set of traces on a flexible substrate;
    forming a second set of traces on the flexible substrate;
    connecting the first set of traces to a negative voltage supply; and
    connecting the second set of traces to a positive voltage supply; and
    cutting a gap in the flexible substrate between the first and second set of traces, the gap positioned to form an arc-break.

2. The method of claim 1, wherein cutting the gap comprises using a laser to cut the gap.

3. The method of claim 1, wherein cutting the gap comprises cutting the gap when the circuit substrate is cut from a larger piece of material.

4. The method of claim 1, wherein cutting the gap comprises forming the gap during formation of the flexible circuit.

5. The method of claim 1, further comprising forming a second gap between the gap and at least one of the sets of traces.

6. A method of forming a print head, comprising:
    forming a first set of traces on a flexible substrate;
    forming a second set of traces on the flexible substrate;
    connecting the first set of traces to a negative voltage supply;
    connecting the second set of traces to a positive voltage supply;
    cutting a gap between the first and second set of traces in the flexible substrate, the gaps configured to for an arc-break;
    stacking a set of plates together to form a jet stack;
    bonding the jet stack to the flexible substrate; and
    mounting an integrated circuit on the flexible substrate.

7. The method of claim 6, wherein cutting the gap comprises using a laser to cut the gap.

8. The method of claim 6, wherein cutting the gap comprises cutting the gap when the circuit substrate is cut from a larger piece of material.

9. The method of claim 6, wherein cutting the gap comprises forming the gap during formation of the flexible circuit.

10. The method of claim 6, further comprising forming a second gap between the gap and at least one of the sets of traces.

* * * * *